United States Patent [19]

Lefèbvre et al.

[11] 4,430,684

[45] Feb. 7, 1984

[54] TRANSISTOR SWITCHING MEANS

[75] Inventors: Marcel Lefèbvre, Angoulême; Daniel Ruellan, L'Isle d'Espagnac, both of France

[73] Assignee: La Telemecanique Electrique, France

[21] Appl. No.: 386,482

[22] Filed: Jun. 9, 1982

Related U.S. Application Data

[63] Continuation of Ser. No. 153,792, May 28, 1980, abandoned.

[30] Foreign Application Priority Data

May 30, 1979 [FR] France ................. 79 13763

[51] Int. Cl.³ ..................... H02H 3/08; H02H 7/20
[52] U.S. Cl. .......................... 361/98; 361/88; 361/91; 361/18; 361/59; 323/282; 330/207 P
[58] Field of Search ............... 361/18, 91, 93, 98, 361/88, 59; 323/282, 265; 330/207 P, 298

[56] References Cited

U.S. PATENT DOCUMENTS

| | | | |
|---|---|---|---|
| 3,449,598 | 6/1969 | Wright | 361/91 |
| 3,835,368 | 9/1974 | Williams | 323/282 X |
| 4,027,228 | 5/1977 | Collins | 323/282 |
| 4,161,760 | 7/1979 | Valentine | 361/18 |

Primary Examiner—Patrick R. Salce
Attorney, Agent, or Firm—William A. Drucker

[57] ABSTRACT

Transistor switching means in which a principal transistor ($T_5$) feeds into a load ($R_c$) when a control signal saturates a control transistor ($T_1$), a resistance bridge ($R_3, R_4$) fed by a source ($V_{AL}$) then polarizing the base of the principal transistor ($T_5$).

An auxiliary transistor ($T_{3a}$) has its base coupled to the collector of the transistor ($T_5$) by means of a diode ($D_{2a}$) and one of the two polarization resistances ($R_{10}$–$R_{11}$). When the collector-emitter voltage of the principal transistor becomes too strong as a result of a short-circuit in the load, the auxiliary transistor ($T_{3a}$) is saturated and blocks the principal transistor ($T_5$).

Application to detectors of the type having an electroluminescent diode excited by pulses; these pulses, applied to the auxiliary transistor ($T_{3a}$) block it momentarily in order to ensure the re-setting of the circuit when the overload has disappeared.

2 Claims, 1 Drawing Figure

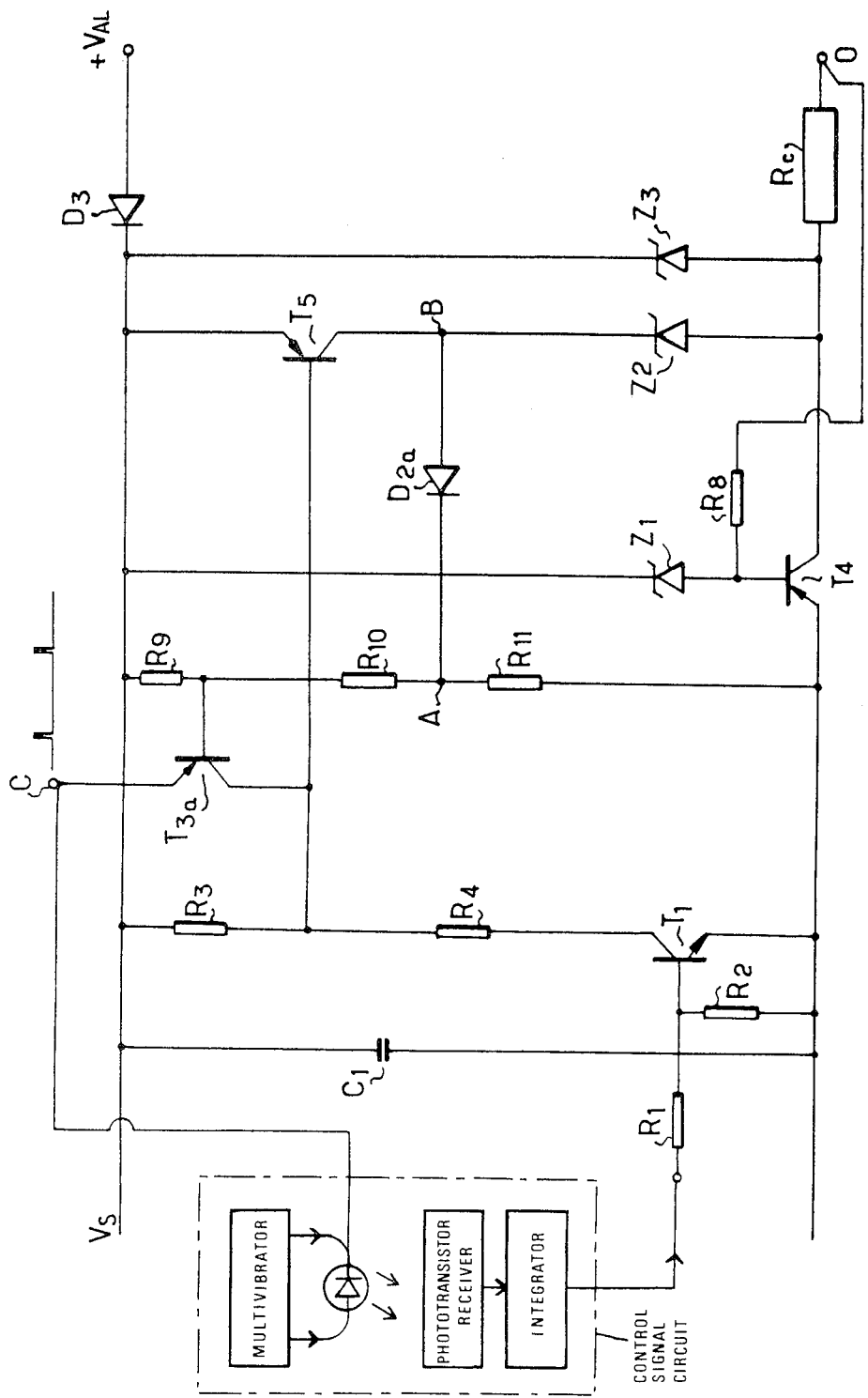

TRANSISTOR SWITCHING MEANS

This is a continuation of Ser. No. 153,792, filed May 28, 1980, now abandoned.

BACKGROUND OF THE INVENTION

The invention relates to all-or-nothing control circuits for the passage of the current in a load of the type utilising at least one principal switching transistor unblocked by injection of a substantially constant current into its base under the action of a control signal.

Among the applications of such circuits there can be mentioned the switching of rest and working signals in a proximity detector or inductive presence detector or a detector with photo-electric cell fed with continuous current.

The problem that the present invention proposes to resolve is that of the protection of the principal switching transistor against overloads or short-circuits at the terminals of the load.

In a known solution, this problem is resolved by having the circuit comprise means for comparing the collector-emitter voltage of the principal transistor with a reference voltage and for blocking the said transistor as soon as the said collector-emitter voltage exceeds the said reference voltage.

In the manner of construction described in French Patent No. 7613927 filed on May 10, 1976 in the name of the same Assignee the said means comprise a first auxiliary transistor, the emitters of the two transistors being common, the collector of the principal transistor and the base of the auxiliary transistor being coupled to a common point, respectively by means of two diodes connected head to tail and a second auxiliary transistor, connected with the first as an unstable multi-vibrator, the collector of the first auxiliary transistor being coupled to the base of the principal transistor.

So long as the voltage of the collector-emitter of the principal switching transistor remains lower than the maximum permitted value, the first auxiliary transistor is blocked and the second is then in the conductive state. Above this maximum value, the first auxiliary transistor becomes unblocked, which has the result of blocking the principal switching transistor. Furthermore, the unblocking of the first auxiliary transistor has the result of blocking the second, thus causing the unstable multi-vibrator to pass to its other state, which provides a pulse on the base of the principal switching transistor, which again passes to the saturated state and can remain therein, if the load has resumed its normal value. There is thus automatic re-setting of the circuit after the disappearance of the short-circuit.

OBJECT OF THE INVENTION

The invention proposes a simplified variant of the means for comparison and for blocking referred to above, a variant which can only be applied when the control signal comes from the integration of recurrent pulses. A particularly interesting application is the case where the said circuit is a detector comprising an electro-luminescent diode emitting light, excited by pulses provided by a multi-vibrator and associated with a photo-transistor receiver the current of which, after shaping if necessary, is integrated to provide the control signal. A circuit of this type is in particular described in French Pat. No. 7913316 filed May 25, 1979 by the same Assignee.

SUMMARY OF THE INVENTION

According to the invention, the means mentioned above for comparison and for blocking comprise an auxiliary transistor coupled to the principal transistor in such a manner that the said auxiliary transistor, normally blocked, becomes unblocked when, as a result of an overload in the load, the voltage drop at the terminals of the principal transistor increases and that the unblocking of the auxiliary transistor has the effect of blocking the principal transistor and that recurrent pulses are applied to the auxiliary transistor in order to block it periodically, thereby to ensure the automatic unblocking of the principal transistor as soon as the overload has disappeared.

Other features, as well as the advantages of the invention, will appear clearly in the light of the following detailed description.

BRIEF DESCRIPTION OF THE DRAWING

The single FIGURE of the accompanying drawing shows a switching means in accordance with a preferred manner of carrying out the invention.

DESCRIPTION OF THE PREFERRED EMBODIMENT

There is shown at $T_1$ a control transistor the base of which is polarised by means of a bridge of resistances $R_1R_2$, by an intermittent control signal applied to the input terminal E.

When $T_1$ is conductive, the base of a principal switching transistor $T_5$, of PNP type in the example described, is polarised, by the passage of the current in the two resistances $R_3,R_4$ in such a manner that $T_5$ becomes conductive. The voltage Vs applied to $R_3$ and $R_4$ is stabilised by means of a transistor $T_4$, a resistance $R_8$ and a Zener diode $Z_1$, and filtered by means of a condenser $C_1$.

As a result, the base current of $T_5$ is constant when the control signal is present.

In the case of overloading in the load Rc, due for example to a short-circuit, a protection transistor $T_{3a}$, here of the PNP type, becomes conductive for the following reasons.

The base of $T_{3a}$ is polarised by the resistances $R_9$, $R_{10},R_{11}$, the point common to $R_9$ and $R_{10}$ being coupled to the said base and the point A common to $R_{10}$ and $R_{11}$ being coupled to the point B of the collector circuit of $T_5$, by means of a diode $D_{2a}$. When $T_5$ is normally saturated, the voltage at B is sufficient for the diode $D_{2a}$ to be conductive. The sum of the voltage drops in the emitter-collector space of $T_5$ in the saturated state and in the diode $D_{2a}$ is then such the potential at point A is higher than the value which would result from the passage of the base current of $T_{3a}$ (in the resistance bridge $R_{10}14 R_{11}$) if $T_3$ was conductive (the transistor $T_{3a}$ can thus only be blocked).

In the case of overload in the load Rc, the voltage drop in the emitter-collector space of $T_5$ increases and the voltage at B becomes insufficient to unblock the diode $D_{2a}$. The transistor $T_{3a}$ then begins to conduct. As a result there is an increase of the voltage drop across $R_4$ and $T_1$, that is to say the polarisation of the base of $T_5$ increases, which serves to block $T_5$. The effect is cumulative and ends with a sufficiently rapid blocking of $T_5$ to avoid its excessive heating.

The pulses generated in the circuit (not shown) which produces the control signal are applied to the emitter of the transistor $T_{3a}$. For example, the point C is for this purpose coupled to the cathode of the electro-luminescent diode mentioned hereinabove and thus receives the pulses generated by the multi-vibrator exciting this diode.

The effect of the overload is clearly only taken into account when the transistor $T_1$ is in the conductive state, as a result of which $T_5$ and $T_{3a}$ can conduct. For the duration of each pulse the transistor $T_{3a}$ is necessarily blocked (the pulses being applied for this purpose with the appropriate polarity).

As a result, $T_5$ becomes unblocked during this period. And at the first pulse which succeeds to the disappearance of the overload, the device automatically re-sets itself. It will be noted nevertheless that, during each of the pulses which occur when the overload is present, $T_5$ must carry a large current under full voltage. This is only acceptable if the cyclic ratio of the pulses is small, which is the case in the control circuit described in the above-mentioned patent, wherein the 4 micro-second pulses are separated by intervals of the order of 1 ms.

There will now be considered the passing of $T_1$ from the blocked state to the conductive state, upon the arrival of a control signal and supposing that, at this moment, there is no possiblity of overload in the load. This instant not coinciding with one of the pulses, $T_{3a}$ is unblocked, absorbs the current of $T_1$, so that $T_5$ can only become unblocked at the instant of the following pulse, $T_{3a}$ becoming blocked at this instant, and remaining blocked so long as no overload occurs. It will thus be seen that the protection device has the result of causing a slight delaying of the switching operation.

However, this delay, less than the period of the pulses, thus of the order of only ms., does not give rise to any practical inconvenience in the example considered.

It will be noted that the protection device described operates even in the case of a slow and progressive increase of the current taken by the load.

It will be obvious that various modifications of detail could be made in the circuit described and shown, without departing from the scope of the invention.

We claim:

1. A switching circuit of the kind comprising a principal switching transistor feeding into a load and unblocked by injection of a substantially constant current into its base in response to application of a control signal to the circuit, the said circuit comprising means for comparing the collector-emitter voltage of the principal transistor with a reference voltage and for blocking the said transistor as soon as the said collector-emitter voltage exceeds the reference voltage, the said control signal being produced by a circuit which generates recurrent pulses and separately derives from said pulses the said control signal said means comprising an auxiliary transistor coupled to the principal transistor in such a manner that the said auxiliary transistor, when blocked, becomes unblocked when, as a result of overloading in the load, the voltage drop at the terminals of the principal transistor increases beyond the reference voltage and the unblocking of the auxiliary transistor then having the effect of blocking the principal transistor, means for applying the said recurrent pulses to the auxiliary transistor to block it periodically, thereby ensuring the automatic unblocking of the principal transistor as soon as the overload has disappeared, even though the substantially constant current is being injected into the base of the principal transistor in response to said control signal being applied to said switching circuit.

2. A switching circuit according to claim 1 characterized in that the base of the auxiliary transistor is polarized by a bridge of two resistances connected across the power supply therefor, the point common to these two resistances being coupled by a diode to the collector of the principal transistor.

* * * * *